US006577154B2

United States Patent
Fifield et al.

(10) Patent No.: US 6,577,154 B2
(45) Date of Patent: Jun. 10, 2003

(54) CONSTANT IMPEDANCE DRIVER FOR HIGH SPEED INTERFACE

(75) Inventors: John A. Fifield, Underhill, VT (US); Russell J. Houghton, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/848,454

(22) Filed: May 3, 2001

(65) Prior Publication Data

US 2002/0163360 A1 Nov. 7, 2002

(51) Int. Cl.[7] .............................................. H03K 17/16
(52) U.S. Cl. .............................. 326/30; 326/34; 326/32; 326/83; 327/539; 327/543
(58) Field of Search .............................. 326/30, 31, 32, 326/33, 34, 82, 83; 327/538, 539, 543

(56) References Cited

U.S. PATENT DOCUMENTS

| | | | |
|---|---|---|---|
| 5,235,222 A | * | 8/1993 | Kondoh et al. ............. 307/475 |
| 5,440,258 A | | 8/1995 | Galbi et al. |
| 5,495,184 A | * | 2/1996 | Des Rosiers et al. ......... 326/73 |
| 5,581,197 A | * | 12/1996 | Motley et al. ................ 326/30 |
| 5,633,605 A | | 5/1997 | Zimmerman et al. |

* cited by examiner

Primary Examiner—Daniel Chang
(74) Attorney, Agent, or Firm—DeLio & Peterson LLC; Peter W. Peterson; Robert A. Walsh

(57) ABSTRACT

A compensated driver for maintaining constant impedance during data transfer from an integrated circuit comprises an output portion having an output device to transfer data from the integrated circuit and a mimic circuit portion having a sample output device scaled to a fraction of the output device adapted to accept a reference current and generate a sample voltage. A mimic circuit portion has a sample output device scaled to a fraction of the output device adapted to accept a reference current and generate a sample voltage. A differential amplifier portion is adapted to generate a control voltage in response to a reference voltage and the sample voltage. A predrive portion applies either a ground or the predetermined control voltage from the differential amplifier portion to the output stage portion in response to an input, the control voltage regulating the output device in the output stage portion to achieve a more constant impedance.

29 Claims, 7 Drawing Sheets

Driver

CONSTANT IMPEDANCE DRIVER FOR HIGH SPEED INTERFACE

BACKGROUND OF THE INVENTION

1. Field of the Invention

The present invention relates to integrated circuit technology and, in particular, to a constant impedance driver for a high speed interface.

2. Description of Related Art

Off-chip drivers are needed to output data, e.g., an address or a logic result, from one integrated circuit (IC) chip and transfer it to another IC chip. Such data is driven through circuitry in various types of devices, such as an IC package, a printed circuit board, or simply wires or cables. Off-chip drivers act as an interface between the output of one IC chip to become input of another IC chip. The most efficient transfer of data is achieved if one knows the interconnecting wiring and load, and designs the off-chip driver to match that impedance. Variable impedance of a driver will cause reflections and data integrity problems.

Memory card systems frequently present a complex inductive/resistive/capacitive (LRC) load with transmission line reflections resulting from multiple dynamic random access memory (DRAM) slots on a single data trace. One method of coping with signal integrity issues in such a system is to use a low-capacitance open-drain driver. The maximum operating frequency is limited by variations in output driver impedance.

U.S. Pat. No. 5,633,605 to Zimmerman et al. entitled Dynamic Bus with Singular Central Precharge is directed to a dynamic bus system with a central precharge device. In this patent, a precharged data bus either remains high denoting a 1 data state, or is pulled low for a 0 data state by an open-drain driver. An advantage of this architecture is lower pin capacitance due to the absence of a PFET pullup in each output driver. The output stage of this type of driver is shown in FIG. 1, and includes a single NFET device and an 8-ohm ballast resistor with a nominal output impedance of 17-ohms. The impedance of this driver is a strong function of process voltage and temperature (PVT).

In view of the problems of the prior art, there is a need for a constant impedance driver. It would also be advantageous to have compensation for a driver to maintain a predetermined drive impedance across variations in process, voltage and temperature (PVT), as well as providing for adjustment of the constant impedance value.

Bearing in mind the problems and deficiencies of the prior art, it is therefore an object of the present invention to provide a constant impedance driver for data transfer between IC devices.

It is another object of the present invention to provide a method and system for compensating a data driver to maintain a predetermined drive impedance across variations in process, voltage and temperature.

A further object of the invention is to provide a constant impedance driver which is adjustable to different impedances, while still maintaining a constant impedance over a wide voltage range.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an integrated circuit including a controlled impedance off-chip driver circuit. The integrated circuit comprises an off-chip driver device which controls output impedance of the off-chip driver circuit according to a level of a control signal input thereto, with the off-chip driver being presented with variable operating conditions. The integrated circuit further includes a control circuit which generates the control signal. The control circuit includes a mimic circuit having a sample driver device being a scaled representative of the off-chip driver device. The level of the control signal varies according to the variable operating conditions presented to the sample driver device. A desired output impedance of the off-chip driver circuit is maintained despite variation in the variable operating conditions.

The off-chip driver device and the sample driver device each may include an NFET, and the control signal may include a variable voltage signal provided to the gate of the NFET. In another embodiment, the off-chip driver device and the sample driver device may each include a PFET, and the control signal may include a variable voltage signal provided to the gate of the PFET.

The control circuit may further include a differential amplifier having inputs from the sample driver and a voltage divider circuit, and outputting a variable voltage signal as the control signal to the off-chip driver device.

Preferably, the mimic circuit further includes a constant current source which supplies the sample driver device, and a sample resistance through which the sample driver is supplied by the constant current source. The sample resistance is scaled and representative of resistance in the off-chip driver circuit.

In another aspect, the present invention is directed to a compensated driver for maintaining constant impedance during data transfer from an integrated circuit comprising an output portion having an output device adapted to transfer data from the integrated circuit and a mimic circuit portion having a sample output device scaled to a fraction of the output device adapted to accept a reference current and generate a sample voltage. The driver further includes a differential amplifier portion adapted to generate a control voltage in response to a reference voltage and the sample voltage. There is also provided a means for switching either the control voltage, a power supply voltage or ground to the output stage in response to a data input, the control voltage regulating the output device in the output stage portion to achieve a more constant impedance.

Preferably, the driver further includes a reference portion adapted to generate a reference voltage, more preferably a voltage divider circuit. The output stage portion may be adapted to change to a different, constant impedance in response to a value of the reference current or to a value of the reference voltage. Preferably, the output device of the output stage portion comprises a multiple of the sample output device of the mimic circuit portion.

The driver may further include a constant current source which supplies the reference current, and a sample resistance in the mimic circuit portion through which the sample output device is supplied by the constant current source, wherein the sample resistance scaled and representative of resistance in the output portion.

In its preferred embodiment, the mimic circuit portion and the differential amplifier portion comprise a negative feedback network to generate the control voltage, and the switching means comprises a predrive portion adapted to apply either a ground or the predetermined control voltage from the differential amplifier portion to the output stage portion in response to an input. The output stage portion may include an NFET output device such that the switching means applies either the ground or the predetermined control voltage to the NFET output device. In another embodiment, the output stage portion may include a PFET output device such that the switching means applies either a power supply voltage or the predetermined control voltage to the PFET output device.

In a further aspect, the present invention provides, in an integrated circuit, a method of maintaining a desired output impedance of an off-chip driver circuit having an off-chip driver device despite variations in operating conditions. The method comprises generating a variable level control signal using a sample driver device being a scaled representative of the off-chip driver device. The control signal varies in level according to variable operating conditions presented to the sample driver device, with the variable operating conditions also being presented to the off-chip driver device. The method further includes applying the variable level control signal to the off-chip driver device to control output impedance of the off-chip driver circuit. Desired output impedance of the off-chip driver circuit is maintained despite variation in the variable operating conditions.

The generating step may further comprise comparing a voltage obtained from operating the sample driver device to a reference voltage, and supplying the sample driver device with constant current. Such constant current may be supplied to the sample device through a sample resistance scaled and representative of resistance in the off-chip driver device.

In yet another aspect, the present invention is directed to a method of compensating a driver for maintaining constant impedance during data transfer from an integrated circuit. The method comprises providing an output portion having an output device adapted to transfer data from the integrated circuit, and generating a reference voltage. A reference current is accepted and there is generated a sample voltage in a mimic circuit portion having a sample output device scaled to a fraction of the output device. A control voltage is generated in a differential amplifier portion in response to the reference voltage and the sample voltage. The method also includes switching either the control voltage, a power supply voltage or ground to the output stage in response to a data input, the control voltage regulating the output device in the output stage portion to achieve a more constant impedance.

Preferably, the reference voltage is generated by a voltage divider circuit. The method may further include changing the reference current or the reference voltage to change the output portion to a different, constant impedance. The output device of the output portion preferably comprises a multiple of the sample output device of the mimic circuit portion. In the preferred embodiment, the differential amplifier develops an error voltage and apply it to the control voltage to cause the mimic circuit portion and the differential amplifier portion to reach equilibrium.

The reference current may be a constant current, and the method may further include providing a sample resistance in the mimic circuit portion scaled and representative of resistance in the output portion, such that the constant current flows through the sample resistance.

The output portion may include an NFET output device such that the switching step applies either the ground or the predetermined control voltage to the NFET output device. In another embodiment, the output portion may include a PFET output device such that the switching step applies either a power supply voltage or the predetermined control voltage to the PFET output device.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
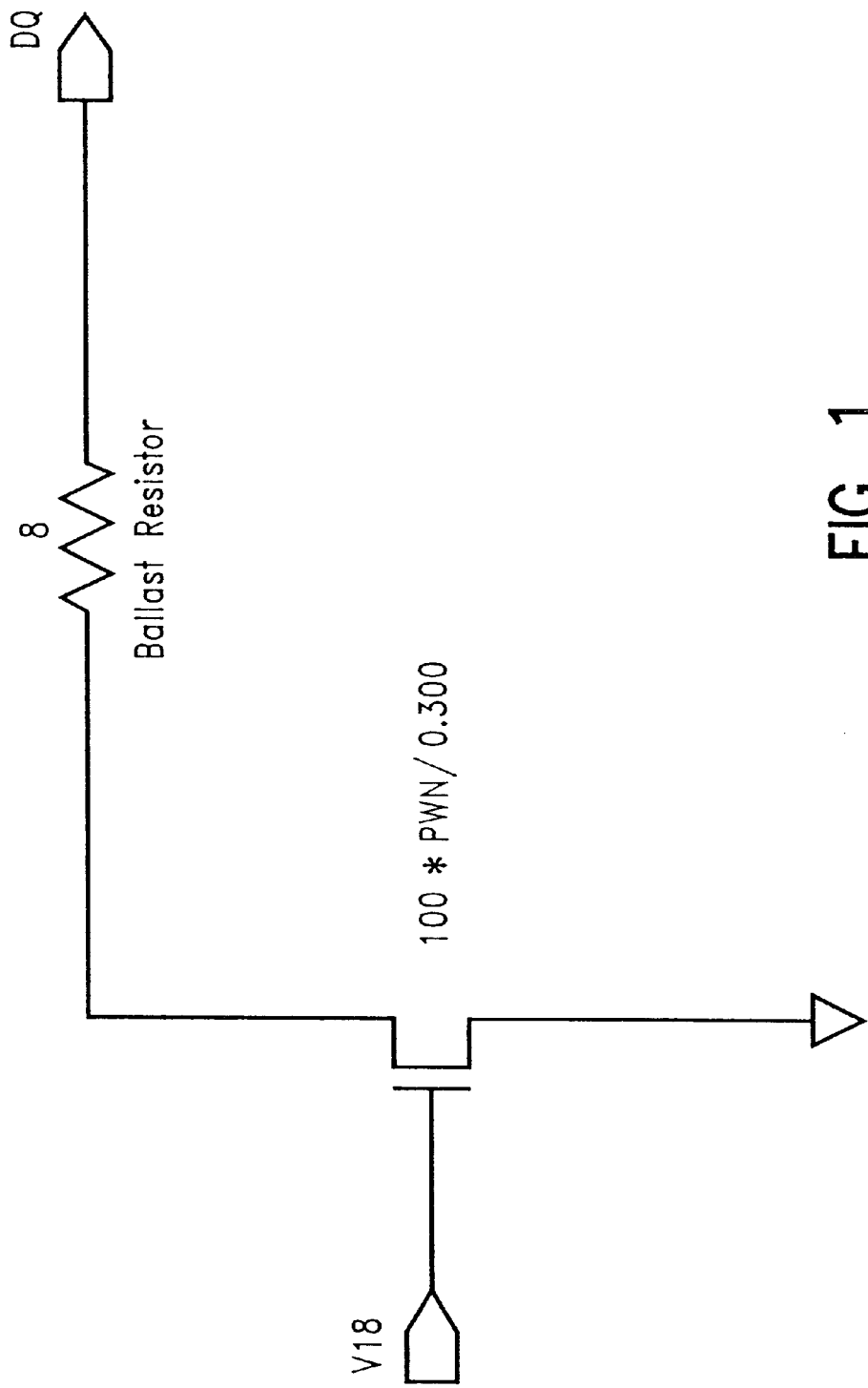
FIG. 1 is a circuit diagram of a prior art output stage of a dynamic bus system driver.

In describing the preferred embodiment of the present invention, reference will be made herein to FIGS. 2–7 of the drawings in which like numerals refer to like features of the invention. Features of the invention are not necessarily shown to scale in the drawings.

The present invention provides a circuit in which the impedance of a driver changes depending on what processing the chip received due to variations in PVT, i.e., processing tolerance, the voltage at which the chip is run, and the temperature of the chip. A non-limiting example of the present invention is as a constant impedance dynamic random access memory (DRAM) driver for a high speed memory interface.

Figure 2:
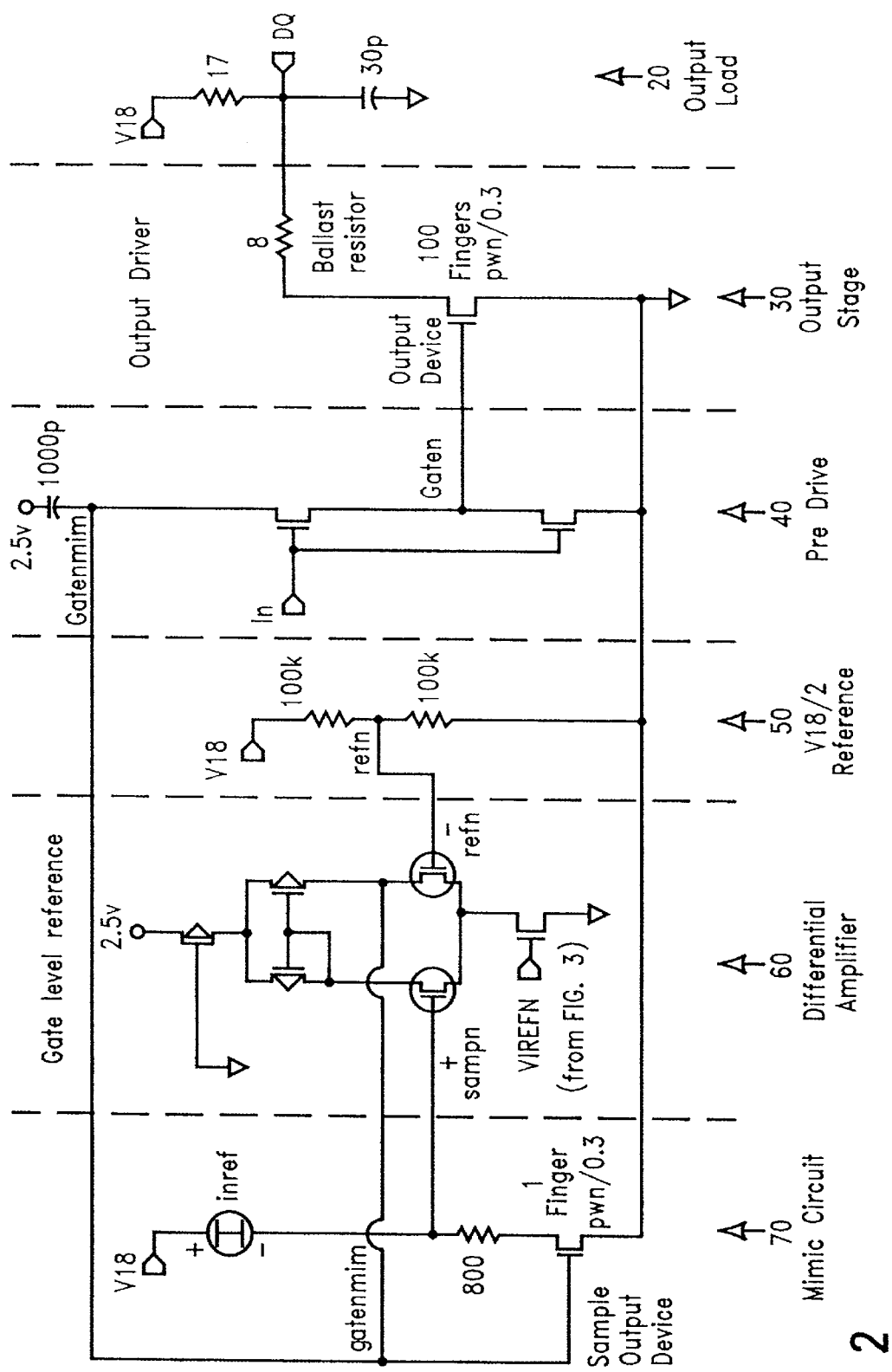
FIG. 2 is a circuit diagram of the preferred embodiment of the constant impedance driver of the present invention.

Referring to FIG. 2, the preferred embodiment of the present invention is shown coupled to output load portion 20, output stage portion 30, predrive stage portion 40, reference portion 50, differential amplifier portion 60, and mimic circuit portion 70. The driver of the present invention is controlled by the differential amplifier portion and mimic circuit portion. The output load 20 is driven by the remaining circuit portions, and is not itself part of the driver circuit of the present invention. While the driver circuit of the present invention is typically located on an integrated circuit chip, and the output load is typically off-chip, the driver circuit may be used for data transfer onto a transmission line and/or load impedance either on or off the same integrated circuit chip as the driver circuit.

Output stage portion 30 shown includes an 8 ohm resistor between the NFET pulldown output device and the output load portion 20. Alternatively, the output stage may be constructed with a PFET output device with appropriate complimentary implementations of mimic circuit portion 70, differential amplifier portion 60, reference portion 50 and predrive stage portion 40. The output device preferably comprises 100 identical copies or fingers of a transistor, which will be explained in more detail below. The output load portion 20 includes a 30 picofarad capacitor as the load for the external data net comprising the integrated circuits to which data is transferred. The output node DQ is terminated to a 1.8 volt supply through a 17 ohm pullup resistor. The preferred embodiment shown uses two power supply voltages, $V_{1.8}$ and $V_{2.5}$, for best headroom for the compensation. Dual power supplies are generally available as input/output levels often drop before the external power supply does as technology advances to new generations.

Predrive stage 40 determines whether ground or some pre-determined control voltage GATENMIM is to be applied to GATEN of the NFET output device in the output stage portion 30. The predetermined control voltage is the gate level reference GATENMIM determined in part from mimic circuit portion 70. Depending on the state of the input data coming in on node IN, the predrive stage portion either switches GATEN of the output stage 30 to ground or to GATENMIM. A 1000 picofarad capacitor is connected between GATENMIM and a 2.5 v external power supply, and acts as a charge reservoir or filter for GATENMIM. Gate voltage GATENMIM is adjusted by the differential amplifier portion 60 and reference mimic circuit portion 70, both of which will be discussed further below.

Reference portion 50 includes two 100 Kohm resistors and provides a voltage divider between 1.8 v and ground. This generates a voltage REFN which is 1.8 v/2=0.9 v. Voltage REFN is a negative input target value to differential amplifier portion 60.

Differential amplifier portion 60 may be a stack of 6 transistors that include a transistor receiving a positive input sample voltage SAMPN from mimic circuit 70, and a transistor receiving a minus input reference voltage REFN from the reference portion 50. The voltage that will appear on SAMPN is roughly proportional to the amount of current that goes through the sample output device in the mimic circuit portion multiplied by the impedance of the mimic resistor and sample output device (V=I*R). The output voltage GATENMIM is determined by and proportional to the REFN and SAMPN inputs. For example, if the voltage rises on the positive input SAMPN, the GATENMIM output voltage will rise, and if the voltage rises on the negative input REFN, the GATENMIM output voltage will drop. The differential amplifier adjusts the GATENMIM voltage output so that sufficient voltage is developed across the sample output device in the mimic circuit portion 70, until the SAMPN voltage is equal to the REFN voltage. At that point, the GATENMIM voltage is held. Other types of differential amplifiers may be used in place of differential amplifier portion 60 shown.

Mimic circuit portion 70 determines the strength of the output transistor at a scaled-down factor and compensates the gate voltage to achieve a constant peak. In the example circuit shown here, mimic circuit portion 70 is scaled by a factor of 100, compared to the output stage portion 30, to reduce operating current therein. The mimic circuit portion and differential amplifier form a feedback network to generate control voltage GATENMIM, which in turn regulates the strength of the output device transistor in output stage portion 30 to achieve a constant, predictable impedance. In other words, the mimic circuit is used to evaluate the strength of the output transistor and adjust its gate voltage to achieve constant impedance.

In the mimic circuit portion 70, the NFET pulldown transistor indicated as the sample output device or sample driver has w/l of parameter width divided by 0.3, or pwn/0.3. This is also known as the beta ratio and refers to the ratio of the width of the transistor and the length of the channel lengths. In accordance with the present invention, the output stage NFET transistor indicated as the output device has the same w/l ratio of pwn/0.3. However, the output device NFET transistor is present in 100 (i.e., the scale factor) copies of the sample output device transistor, or fingers, all in parallel. Likewise, if the output device is a PFET, the mimic circuit will have a scaled-down PFET as the sample output device. It is preferable that the mimic sample output device is of an identical, but proportionally smaller, geometry than the predetermined number of fingers or devices of the output device or driver. It is also preferable to have a circuit layout that locates or nests the reference or sample output device transistor in close proximity to the fingers of the output device transistor because of across-the-chip line variations (ACLV) such as line width variations, processing variations, proximity effects, and other variations in manufacturing. For example, the reference sample output device transistor may be disposed between 50 output fingers of the output device on one side and the remaining 50 output fingers on the other side. In this way, the variations due to proximity effects or geometrical variations across the chip will be minimized.

Figure 3:
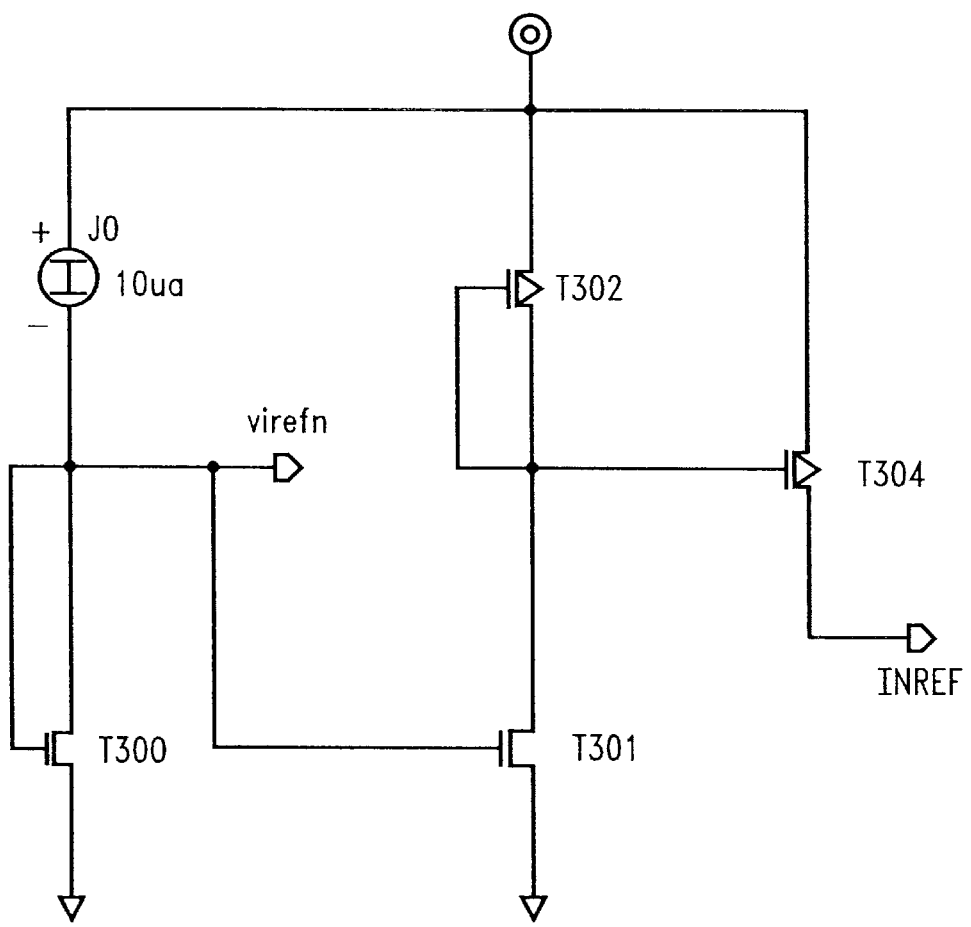
FIG. 3 is a circuit diagram of a bandgap equivalent circuit employed with the constant impedance driver

The INREF current in the mimic circuit portion 70 is a constant reference current generated by an on-chip bandgap reference circuit, as shown in FIG. 3. A constant current can be obtained from a bandgap reference or other source and is represented by the 10 $\mu$a supply J0. Current mirroring techniques are used to develop a gate voltage VIREFN to reflect this current level to other FET devices from FET T300. A positive current reference is scaled from J0 through T302, T301 and T304 and is output as INREF, also using current mirroring techniques. Such bandgap equivalent circuits are known in the art as a way of generating precise currents on-chip. Alternatively, the INREF current may be derived through other known means.

The object of mimic circuit 70 is to output a gate level which is required when a current equal to $V_{1.8}$ divided by $2*Z_{out}$ divided by the scale factor is flowing through it. In this example, the scale factor is 100, so the mimic ballast resistor is 800 ohm, 100 times larger than the 8 ohm resistor in output stage portion 30. The INREF current is directed down through the 800 ohm resistor and the one finger of the sample output device to create a proportional, scaled version of the output device in output stage portion 30. When the reference impedance of Scale Factor*$Z_{out}$ is achieved at the SAMPN node relative to ground, the voltage on SAMPN will equal $V_{1.8}/2=0.9$ v or it will equal the reference voltage. The differential amplifier will develop an error voltage and apply it to GATENMIM to cause this feedback system to reach equilibrium.

With the current and resistance in the reference circuit scaled by 100, gate voltage GATENMIM is generated which will gate enough current to create 0.9 volts across the scaled-down mimic circuit driver and resistor element in series with a reference current INREF generated by an on-chip bandgap reference circuit. For a 17 ohm driver, the ratio of the voltage on that driver divided by the current is equal to 17. In the mimic circuit the driver strength is scaled down by a factor of 100 so as not to use more current than necessary. Current INREF is generated such that if 0.9 volts appears on SAMPN, mimic circuit effectively provides a 17 ohm driver, i.e., by the scale factor, a 1700 ohm driver. Gate voltage GATENMIM is generated to make the mimic circuit perform as a 1700 ohm driver. Accordingly, gate voltage GATENMIM is generated which will cause enough current to flow to create an output impedance of $100*Z_{out}$ in the reference circuit's mimic driver. This generated gate voltage will be adjusted by the differential amplifier portion 60 to maintain a constant relationship of $Z_{out}$ impedance at the target fraction of $V_{1.8}/2=0.9V$, INREF current of 529 $\mu a$, and the scale factor of 100.

In operation, when the circuit is first powered on, REFN may be 0.9 volts (1.8 v/2) on the negative input of the differential amplifier and SAMPN may be at ground. Alternatively, the voltage of the positive input terminal may be greater than that of the negative input terminal. This will cause the GATENMIM voltage to rise. And as GATENMIM rises, current will begin conducting through the mimic portion sample device transistor, and the voltage on SAMPN will fall. This iterative action will continue until this circuit reaches an equilibrium, when a GATENMIM voltage has been generated that will bring SAMPN voltage down to 0.9 volts, the same as the REFN negative input. This equilibrium is reached through the action of negative feedback. Accordingly, this differential amplifier circuit generates a second reference voltage, or an output voltage GATENMIM, which is then applied to the single finger of the sample output device in the mimic circuit portion 70. The sample output device is connected to a ballast resistor which is adjusted by the scale factor, in this example, 100, to be 800 ohms, as compared to 8 ohms of the ballast resistor of output stage 30.

In the circuit shown, $$V_{SAMPN}/\text{INREF}=Z_{out}*SF$$

where $V_{SAMPN}$ is the voltage on SAMPN, INREF is the current, $Z_{out}$ is the output impedance and SF is the scale factor. In the example circuit shown, the scale factor is 100, the desired output impedance is 17 ohms, and SAMPN voltage we want is V1.8/2. Solving for INREF gives a current of 529 $\mu A$. Using Ohm's law, when an INREF current of 529 $\mu A$ is supplied in the mimic circuit portion 70, when SAMPN rises to 0.9 volts, the gate voltage, GATENMIM, is sufficient to create a 17 ohm driver.

This gate level reference circuit generates the output voltage GATENMIM which is then applied through the predrive stage portion 40 to the gate of the output device in the output stage portion 30 to gate an appropriate amount of current from the external data net to provide a constant output impedance. The predrive stage portion here operates essentially as a pure transfer switch.

In order to change the constant output impedance to a different impedance value, either the voltage level of REFN may be changed or the INREF current may be changed. The first method requires only a change in $V_{REFN}$ in the circuit shown, by changing $V_{1.8}$ in the reference portion 50 to some other value. In this regard the output impedance $Z_{out}$ can be also adjusted by selection of resistors in the reference portion 50 resistor divider or by other means which causes the differential amplifier portion 60 to compute a solution at a different $Z_{out}$ impedance.

In the second method, the INREF current may be adjusted in accordance with the aforementioned equation $$V_{SAMPN}/\text{INREF}=Z_{out}*SF$$

Adjustments in INREF will cause the effective output impedance $Z_{out}$ to change. A change in the REFN voltage which causes the voltage of SAMPN to change would create a different value than the aforementioned ratio of $V_{SAMPN}$, the voltage on SAMPN, to the current INREF, and would be a new ratio which would define a new output impedance $Z_{out}$. These values may be determined by those skilled in the art without undue experimentation.

Figure 4:
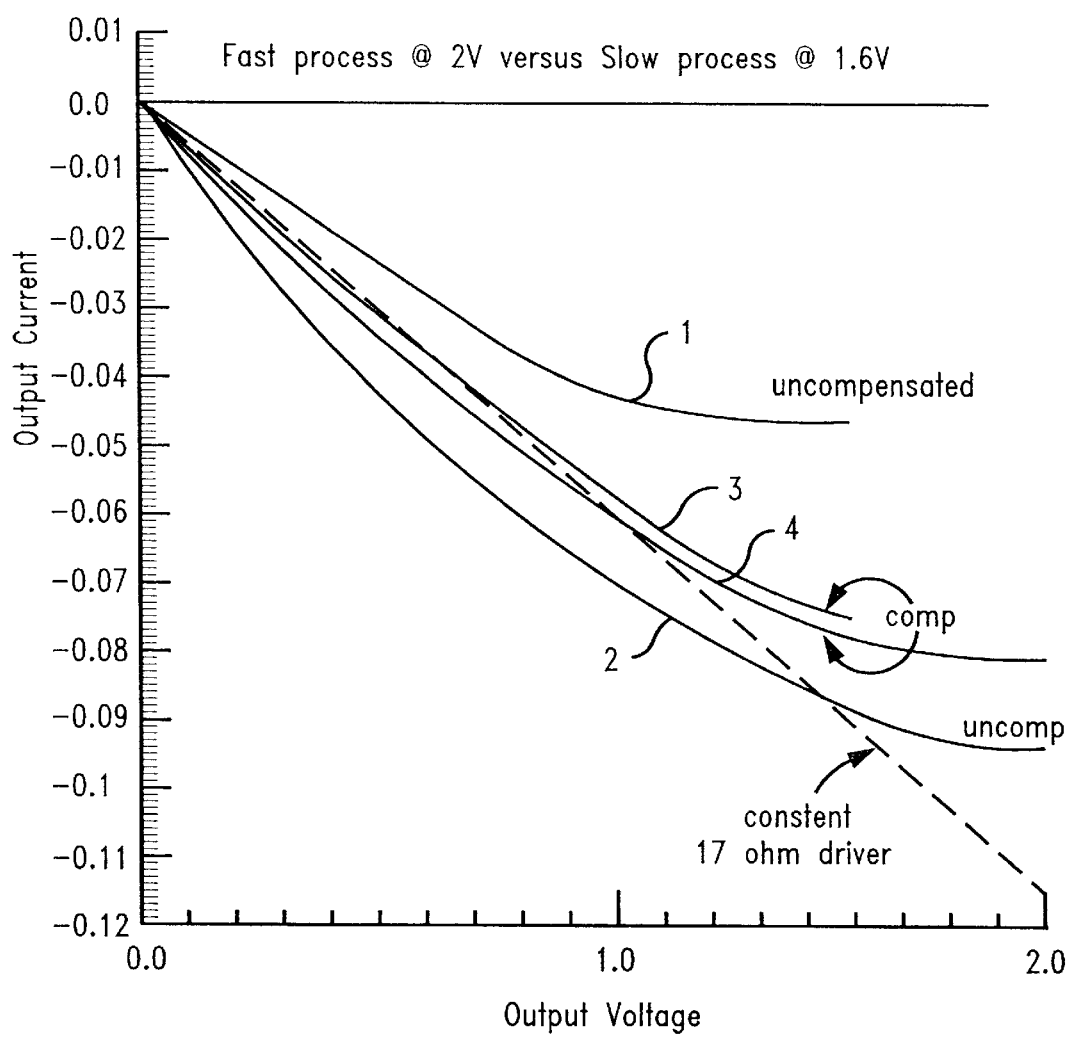
FIG. 4 is a graphical representation of the fast and slow process impedance characteristics of the preferred constant impedance driver of the present invention compared to prior art drivers and to an ideal driver.
Figure 5:
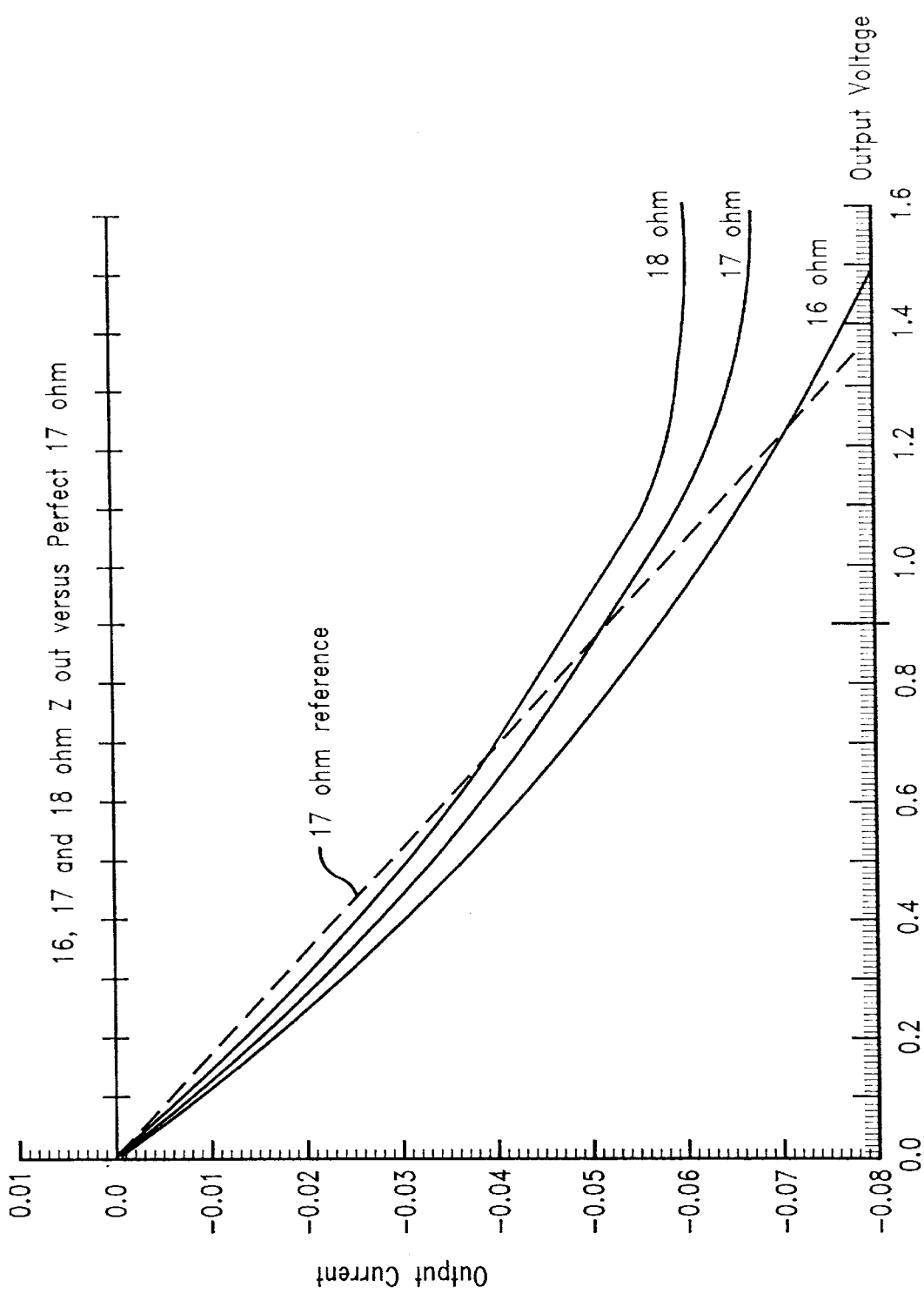
FIG. 5 is a graphical representation of the impedance adjustment characteristics of the preferred constant impedance driver of the present invention compared to an ideal drivers.
Figure 6:
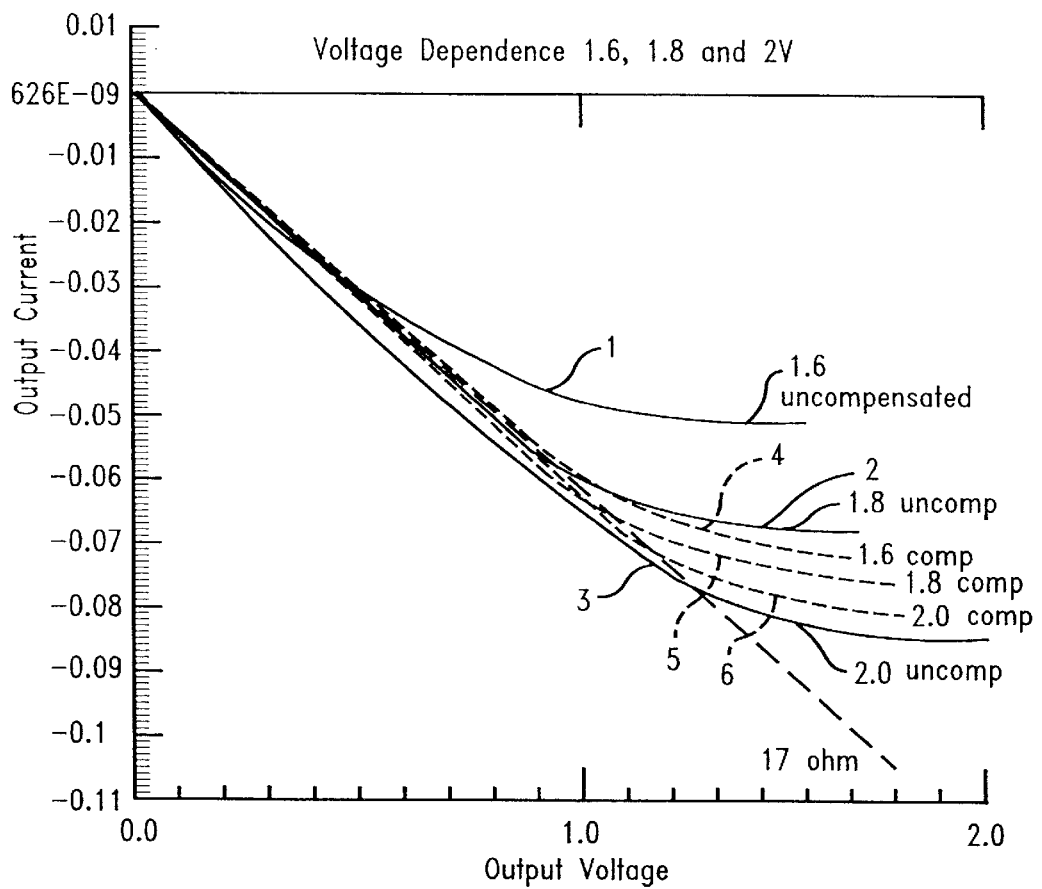
FIG. 6 is a graphical representation of the output current versus voltage of the preferred constant impedance driver of the present invention compared to prior art drivers.

FIGS. 4–6 describe the characteristics and advantages of the present invention.

FIG. 4 is a graphical comparison of the output current as a function of output voltage for the constant impedance driver of the present invention, as compared to prior art and ideal devices, for a fast process at 2.0 v and a slow process at 1.6 v. The vertical axis shows output current and the horizontal axis is output voltage. Using Ohm's law, impedance is voltage divided by current, so the dotted line represents an ideal constant 17 ohm driver. In an ideal device, the current adjusts linearly regardless of the output voltage.

Lines 1 and 2 show the impedance at various output voltages of traditional uncompensated drivers. Line 1 shows the driver operating to 1.6 v, with the slowest process, i.e., longest channel lengths, lowest current, lowest voltage devices and the highest temperature, while line 2 shows the driver operating to 2 v with the fastest process, i.e., lowest temperature, with short channel lengths, highest current and highest voltage. Line 1 follows the ideal dotted line impedance fairly closely from 0 v until about 0.6 v, where it begin to depart from the desired impedance level. This is because the device begins to saturate and no longer behaves as a linear element; following the saturation law, further voltage across its source and drain will no longer deliver a proportional amount of current, so that it is an unsatisfactory driver above about 0.6 volts. Line 2, operating to 2 v, departs from the ideal dotted 17 ohm line almost from the beginning, and is also not linear. As frequencies are increasing, memory drivers are approaching the gigahertz range. Prior art, uncompensated types of drivers will limit performance and are not satisfactory for future high frequency designs.

Lines 3 and 4 represent the comparable curves for the compensated driver of the present invention operating to 1.6 v and 2.0 v, respectively, and with the slowest and fastest process, respectively. In contrast to lines 1 and 2 of the prior art, lines 3 and 4 more closely resemble the ideal 17 ohm line over a wider operating range, and more closely delivers the ratio of 17 ohms over a wider operating range. Accordingly, the compensated driver of the present invention provide a compensation method and system to overcome the variability caused the maximum $3\sigma$ extremes of process, voltage and temperature variations.

FIG. 5 shows the performance of compensated 16, 17 and 18 ohm drivers of the present invention compared to an ideal 17 ohm driver. By changing reference current INREF to proportional values, one can adjust the impedance of the driver of the present invention to 16, 17, or 18 ohms and still have a satisfactory operating range.

FIG. 6 shows the independence of the compensated drive of the present invention to voltage change, as compared with an uncompensated driver of the top and very bottom impedance curves. The uncompensated drivers are lines 1, 2 and 3 while the compensated drivers are lines 4, 5 and 6; all are shown at 1.6, 1.8 and 2 volts. The present invention shows much less variation to voltage change.

Figure 7:
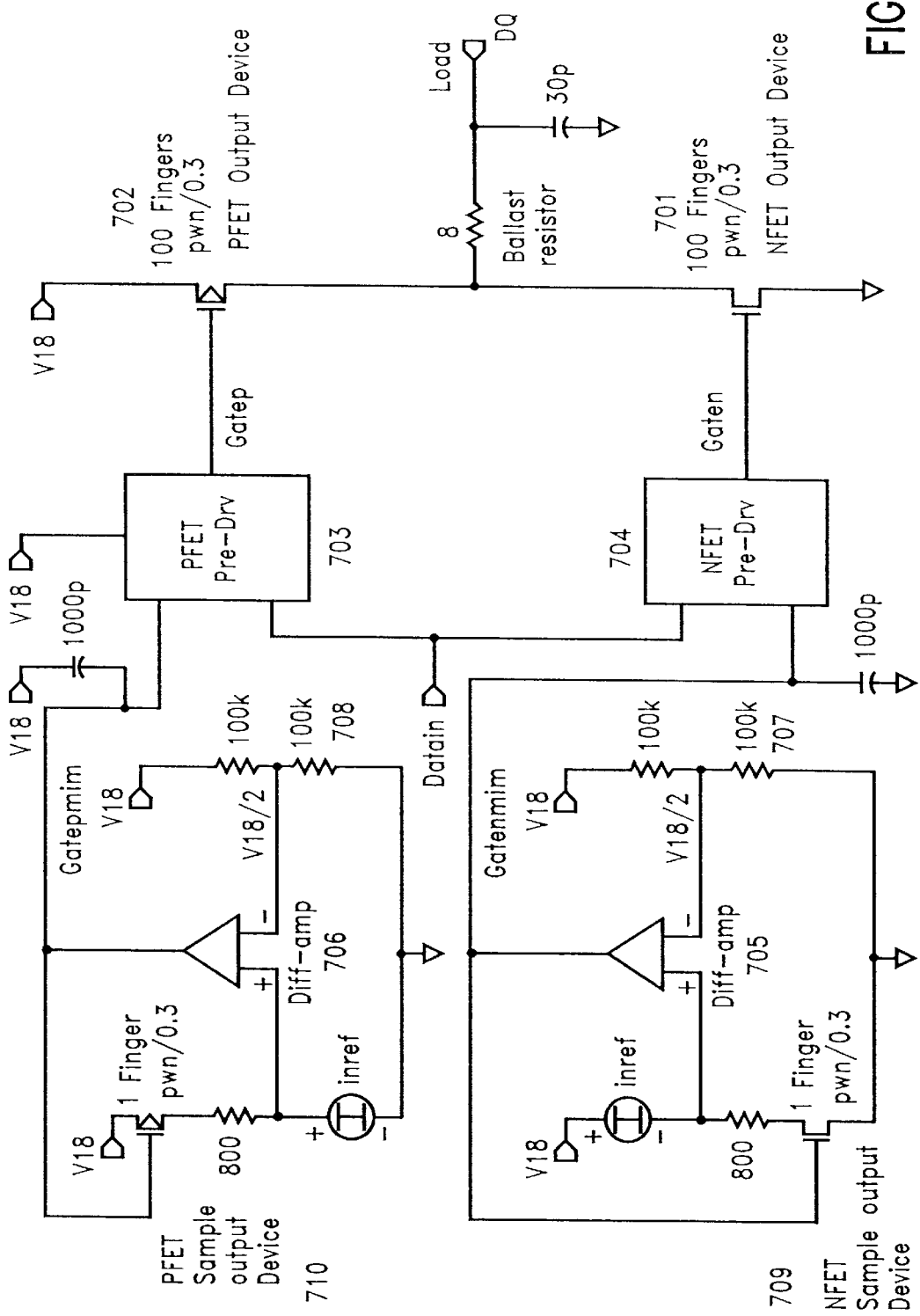
FIG. 7 is a circuit diagram of another embodiment of the constant impedance driver of the present invention.

FIG. 7 shows an alternate embodiment of the constant impedance driver of the present invention where a push-pull driver is demonstrated using the PFET dual of the constant impedance technique along with the NFET circuit implementation described earlier in connection with FIG. 2.

NFET driver 701 is driven by predriver stage 704, which switches either GND or GATENMIM to control gate GATEN, depending on DATAIN input. The GATENMIM level is generated as described earlier, using diff-amp 705, V18/2 reference 707, and NFET Sample Output Device 709. A charge reservoir device is shown referenced to GND. Similarly, output PFET 702 is shown driven by predrive stage 703 which either switches GATEPMIM or power supply voltage V18 to the control gate GATEP. The GATEPMIM level is generated in a similar circuit as is GATENMIM above. Specifically, Diff-amp 706, V18/2 reference 708 and PFET sample output device 710 construct to generate a GATEPMIM voltage which will maintain a constant output impedance of output PFET device 702. Charge reservoir capacitor is shown referenced to V18. Reference levels, INREF current levels and other components can be adjusted to change impedance of NFET and PFET levels independently if desired. It may be desired to alter the INREF level by digital switching of binary reference diodes, or current mirror sizes of T300, T301, T302 or T304 within FIG. 3 to make predictable impedance level changes. Such a circuit adjustment may be made without undue experimentation and is considered within the scope of the invention.

Accordingly, the present invention provides an improved constant impedance driver for data transfer between IC devices, with improved linearity, as well as an improved method and system for compensating a data driver to maintain a predetermined drive impedance across variations in process, voltage and temperature. The constant impedance driver is adjustable to different impedances by varying parameters in the circuit, as discussed above, while still maintaining a constant impedance over a wide voltage range.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An integrated circuit including a controlled impedance off-chip driver circuit comprising:
    an off-chip driver device having a single FET and a ballast resistor between the FET and an output node which controls output impedance of said off-chip driver circuit according to a level of a control signal input thereto, said off-chip driver being presented with variable operating conditions;
    a control circuit which generates said control signal, said control circuit including a mimic circuit having a sample driver device being a scaled representative of said off-chip driver device, said level of said control signal varying according to said variable operating conditions presented to said sample driver device,
    such that a desired output impedance of said off-chip driver circuit is maintained despite variation in said variable operating conditions.

2. The integrated circuit of claim 1 wherein said off-chip driver device includes an NFET, and said sample driver device includes an NFET.

3. The integrated circuit of claim 2 wherein said control signal includes a variable voltage signal provided to the gate of the off-chip driver device NFET.

4. The integrated circuit of claim 1 wherein said off-chip driver device includes a PFET, and said sample driver device includes a PFET.

5. The integrated circuit of claim 4 wherein said control signal includes a variable voltage signal provided to the gate of the off-chip driver device PFET.

6. The integrated circuit of claim 1 wherein said mimic circuit further includes a constant current source which supplies said sample driver device.

7. The integrated circuit of claim 6 wherein said mimic circuit further includes a sample resistance through which said sample driver is supplied by said constant current source, said sample resistance scaled and representative of resistance in said off-chip driver circuit.

8. The integrated circuit of claim 1 wherein said control circuit further includes a differential amplifier having inputs from said sample driver and a voltage divider circuit, and outputting a variable voltage signal as said control signal to said off-chip driver device.

9. The integrated circuit of claim 8 wherein said mimic circuit further includes a constant current source which supplies said sample driver device.

10. The integrated circuit of claim 9 wherein said mimic circuit further includes a sample resistance through which said sample driver is supplied by said constant current source, said sample resistance scaled and representative of resistance in said off-chip driver circuit.

11. A compensated driver for maintaining constant impedance during data transfer from an integrated circuit comprising:
    an output portion having an output device adapted to transfer data from the integrated circuit;
    an adjustable reference portion comprising a voltage divider circuit adapted to generate a desired value of a reference voltage;
    a mimic circuit portion having a sample output device scaled to a fraction of the output device adapted to accept a reference current and generate a sample voltage;
    a differential portion adapted to generate a control voltage in response to the amplifier reference voltage and the sample voltage; and
    means for switching either the control voltage, a power supply voltage or ground to the output portion in response to a data input, the control voltage regulating the output device in the output portion to achieve a more constant impedance and the output portion being adapted to change to a different, constant impedance in response to an adjustable value of the reference current or t an adjustable value of the reference voltage.

12. The driver of claim 11 wherein the scale of the output device of the output portion comprises a multiple of the scale of the sample output device of the mimic circuit portion.

13. The driver of claim 11 further including a constant current source which supplies said reference current.

14. The driver of claim 13 wherein further including a sample resistance in the mimic circuit portion through which said sample output device is supplied by said constant current source, said sample resistance scaled and representative of resistance in the output portion.

15. The driver of claim 11 wherein the mimic circuit portion and the differential amplifier portion comprise a negative feedback network to generate the control voltage.

16. The driver of claim 11 wherein the output portion includes an NFET output device and wherein the switching means applies either the ground or the predetermined control voltage to the NFET output device.

17. The driver of claim 11 wherein the output portion includes a NFET output device and wherein the switching means applies either the power supply voltage or the predetermined control voltage to the PFET output device.

18. In an integrated circuit, a method of maintaining a desired output impedance of an off-chip driver circuit having an off-chip driver device despite variations in operating conditions, comprising:

generating a variable level control signal responsive to an adjustable value of a reference current or to an adjustable value of a reference voltage using a sample driver device being a scaled representative of said off-chip driver device, said control signal varying in level according to variable operating conditions resented to said sample driver device, said variable operating conditions also being presented to said off-chip driver device; and applying said variable level control signal to said off-chip driver device to control output impedance of said off-chip driver circuit, whereby desired output impedance of said off-chip driver circuit is maintained despite variation in said variable operating conditions.

19. The method of claim 18 wherein said generating further comprises comparing a voltage obtained from operating said sample driver device to a reference voltage.

20. The method of claim 19 wherein said generating further comprises supplying said sample driver device with constant current.

21. The method of claim 20 wherein said constant current is supplied to said sample device through sample resistance scaled and representative of resistance in said off-chip driver device.

22. A method of compensating a driver for maintaining constant impedance during data transfer from an integrated circuit comprising:

providing an output portion having an output device having a single FET and a ballast resister between the VET and an output node adapted to transfer data from the integrated circuit;

generating a reference voltage;

accepting a reference current and generating a sample voltage in a mimic circuit portion having a sample output device scaled to a fraction of the output device;

generating a control voltage in a differential amplifier portion in response to the reference voltage and the sample voltage;

switching either the control voltage, a power supply voltage or ground to the output portion in response to a data input, the control voltage regulating the output device in the output portion to achieve a more constant impedance; and changing the current or the reference voltage to change the output portion to a different, constant impedance.

23. The method of claim 22 wherein the reference voltage is generated by a voltage divider circuit.

24. The method of claim 22 wherein the scale of the output device of the output portion comprises a multiple of the scale of the sample output device of the mimic circuit portion.

25. The method of claim 22 wherein the differential amplifier develops an error voltage and applies it to the control voltage to cause the mimic circuit portion and the differential amplifier portion to reach equilibrium.

26. The method of claim 22 wherein said reference current is a constant current.

27. The method of claim 26 further including a sample resistance in the mimic circuit portion scaled and representative of resistance in the output portion, and wherein said constant current flows through said sample resistance.

28. The method of claim 22 wherein the output portion includes an NFET output device and wherein the switching step applies either the ground or the predetermined control voltage to the NFET output device.

29. The method of claim 22 wherein the output portion includes a PFET output device and wherein the switching step applies either a power supply voltage or the predetermined control voltage to the PFET output device.

* * * * *